(12) United States Patent
Nath et al.

(10) Patent No.: US 9,531,412 B2
(45) Date of Patent: *Dec. 27, 2016

(54) SYSTEMS AND METHODS FOR A RADIO FREQUENCY TRANSMITTER WITH IMPROVED LINEARITY AND POWER OUT UTILIZING PRE-DISTORTION AND A GAN (GALLIUM NITRIDE) POWER AMPLIFIER DEVICE

(71) Applicant: Aviat U.S., Inc., Santa Clara, CA (US)

(72) Inventors: Jayesh Nath, Milpitas, CA (US); Ying Shen, Chapel Hill, NC (US); Frank Matsumoto, San Ramon, CA (US); Youming Qin, Sunnyvale, CA (US); David C. M. Pham, Fremont, CA (US)

(73) Assignee: Aviat U.S., Inc., Santa Clara, CA (US)

( * ) Notice: Subject to any disclaimer, the term of this patent is extended or adjusted under 35 U.S.C. 154(b) by 5 days.

This patent is subject to a terminal disclaimer.

(21) Appl. No.: 14/704,468

(22) Filed: May 5, 2015

(65) Prior Publication Data

US 2015/0236732 A1 Aug. 20, 2015

Related U.S. Application Data

(63) Continuation of application No. 13/348,329, filed on Jan. 11, 2012, now Pat. No. 9,065,397.

(Continued)

(51) Int. Cl.
*H04B 1/04* (2006.01)
(52) U.S. Cl.
CPC ..... *H04B 1/0475* (2013.01); *H04B 2001/0425* (2013.01)

(58) Field of Classification Search
CPC ..... H03F 1/3247; H03F 2200/204; H03F 3/24
See application file for complete search history.

(56) References Cited

U.S. PATENT DOCUMENTS 5,703,531 A 12/1997 Vaughn et al.
7,026,871 B2 4/2006 Saed
(Continued)

OTHER PUBLICATIONS

Raab, Frederick H. et al., "Power Amplifiers and Transmitters for RF and Microwave," IEEE Transactions on Microwave Theory and Techniques, vol. 50, No. 3, pp. 814-826, Mar. 1, 2002.

(Continued)

*Primary Examiner* — Wesley Kim
*Assistant Examiner* — Richard Chan
(74) *Attorney, Agent, or Firm* — Sheppard, Mullin, Richter & Hampton LLP

(57) ABSTRACT

Various embodiments provide for systems and methods for increased linear output power of a transmitter. An exemplary wireless communications system for transmitting an input signal comprises a predistorter module, a GaN power amplifier, a coupler, and an antenna. The predistorter module is configured to detect existing distortion by comparing the input signal to a feedback signal and generate a correction signal. The predistorter may adaptively adjust its operation to minimize the existing distortion due to GaN power amplifier nonlinear characteristics. The result is that the GaN power amplifier may send a power signal of improved linearity to the antenna. The coupler is configured to sample the amplified signal from the GaN power amplifier to generate the feedback signal. The antenna is configured to transmit the amplified signal.

20 Claims, 7 Drawing Sheets

Related U.S. Application Data

(60) Provisional application No. 61/431,796, filed on Jan. 11, 2011.

(56) References Cited

U.S. PATENT DOCUMENTS

| | | | |
|---|---|---|---|
| 7,085,330 B1 | 8/2006 | Shirali | |
| 7,113,037 B2* | 9/2006 | Nezami | H03F 1/3247 330/149 |
| 7,508,267 B1 | 3/2009 | Yu et al. | |
| 2001/0051504 A1 | 12/2001 | Kubo et al. | |
| 2002/0186078 A1 | 12/2002 | Kobayashi | |
| 2005/0163251 A1* | 7/2005 | McCallister | H03F 1/3247 375/296 |
| 2005/0190857 A1* | 9/2005 | Braithwaite | H03F 1/3247 375/296 |
| 2007/0165745 A1 | 7/2007 | Fonden et al. | |
| 2008/0008263 A1 | 1/2008 | Keerthi et al. | |
| 2008/0095264 A1 | 4/2008 | Deng et al. | |
| 2008/0130788 A1* | 6/2008 | Copeland | H03F 1/3247 375/297 |
| 2008/0144709 A1* | 6/2008 | McCallister | H03F 1/3247 375/233 |
| 2008/0238544 A1 | 10/2008 | Morris et al. | |
| 2008/0260066 A1* | 10/2008 | Cai | H03F 1/3294 375/297 |
| 2008/0285640 A1* | 11/2008 | McCallister | H04L 25/03044 375/233 |
| 2009/0206928 A1 | 8/2009 | Bowles et al. | |
| 2010/0109771 A1 | 5/2010 | Baik et al. | |
| 2010/0237948 A1 | 9/2010 | Nguyen et al. | |
| 2011/0098011 A1 | 4/2011 | Camp et al. | |
| 2013/0200951 A1* | 8/2013 | Irvine | H03F 1/3247 330/149 |

OTHER PUBLICATIONS

Vassilakis, B. et al., "Comparative Analysis of GaAs/LDMOS/GaN High Power Transistors in a Digital Predistortion Amplifier System," Microwave Conference Proceedings, APMC 2005, Asia-Pacific Conference Proceedings, vol. 2, pp. 1-4, Dec. 4, 2005.

European Application No. 12734113.9, Extended European Search Report mailed Apr. 25, 2014.

International Application No. PCT/US2012/020971, International Search Report and Written Opinion mailed Apr. 3, 2012.

European Application No. 12734113.9, Examination Report mailed Jun. 1, 2016.

* cited by examiner

SYSTEMS AND METHODS FOR A RADIO FREQUENCY TRANSMITTER WITH IMPROVED LINEARITY AND POWER OUT UTILIZING PRE-DISTORTION AND A GAN (GALLIUM NITRIDE) POWER AMPLIFIER DEVICE

CROSS-REFERENCE TO RELATED APPLICATIONS

This application is a continuation of and claims priority to U.S. Non-Provisional patent application Ser. No. 13/348,329 filed Jan. 11, 2012, entitled "Systems and Methods for a Radio Frequency Transmitter With Improved Linearity and Power Out Utilizing Pre-distortion and A GaN (Gallium Nitride) Power Amplifier Device," which claims priority to U.S. Provisional Application Ser. No. 61/431,796 filed Jan. 11, 2011, entitled "Radio Frequency Transmitter with Improved Linearity and Power Out Utilizing Pre-Distortion and a GaN (Gallium Nitride) Power Amplifier Device" which are hereby incorporated by reference.

FIELD OF THE INVENTION(S)

The present invention(s) relate to transmitters, and more particularly, some embodiments relate to systems and methods for improved transmitter output power.

DESCRIPTION OF THE RELATED ART

With ever increasing and nearly ubiquitous use of wireless communication services, the demand for backhaul capacity for wireless communication networks is increasing exponentially. While in the past a few T1 lines (1.544 Mbps) were usually sufficient to link wireless base stations and mobile switching centers, today the requirement has grown to a few hundred T1 lines and is increasing every year. Buying additional T1 lines is not only a significant recurring expense but, in many cases, the capacity simply does not exist. Further, new copper line or fiber optic cables are often required. The latter option is typically very time consuming and expensive in the developed world and is prone to theft. Further, there can be lengthy right-of-way issues that must be resolved.

A high capacity microwave point-to-point link is a viable alternative that has low recurring cost and practically no right-of-way issues. Installation can usually be completed in a few weeks once the licensing has been secured. A microwave link essentially consists of a pair of wireless transmitter and receiver, one at each end. One of the most important parameters of such a link is the output power of the transmitter which directly affects the system gain of the link and therefore the size of the antenna that must be used for a given link distance. In a wireless backhaul network, higher output power is almost universally preferred and is only limited by the linear output power that can be obtained from the transmitter while meeting regulatory and power consumption requirements.

Another important aspect of microwave radio link design is the efficiency of the power amplifier. Typically, almost 40 to 60% of the total DC budget of a transceiver is consumed by the power amplifier (PA) alone. The efficiency limitation is a result of the requirement that the output power from the PA must be obtained at or below a specified IMD3 level. This is required to both meet the regulatory requirement (such as those specified by FCC in US and ETSI in Europe) and to achieve a specified BER on the receiver side for a given received signal level.

Power amplifiers for microwave radios typically use one or more stages of GaAs FETs operated at a drain voltage of 8 V to 12 V and in Class A mode to achieve the linearity requirement. The output power capability of GaAs is in the range of 1 W/mm of periphery. For high output power radio this necessitates the use of larger devices or multiple devices in parallel. Both solutions have significant drawbacks. The former causes significant difficulty in matching the power amplifier over any reasonable amount of bandwidth and forces the design of multiple power amplifiers modules to cover a specific band. The latter involves the use of multiple couplers, power combiners, and dividers, thereby increasing the number of components and also increasing loss (i.e., reducing power combining efficiency). Both the cost of the PA module and its reliability are adversely affected.

SUMMARY OF EMBODIMENTS

Various embodiments provide for systems and methods for increased linear output power of a transmitter. An exemplary wireless communications system for transmitting an input signal comprises a predistorter module, a GaN power amplifier, a coupler, and an antenna. The predistorter module is configured to detect existing distortion by comparing the input signal to a feedback signal and generate a correction signal. The predistorter may adaptively adjusts its operation to minimize the existing distortion due to GaN power amplifier nonlinear characteristics. The result is that the GaN power amplifier may send a power signal of improved linearity to the antenna. The coupler is configured to sample the amplified signal from the GaN power amplifier to generate the feedback signal. The antenna is configured to transmit the amplified signal.

In some embodiments, the GaN power amplifier may add amplifier distortion to the amplified signal. At least some of the added distortion from the predistorter module may cancel at least some of the amplifier distortion. The input signal may be at an intermediate frequency.

In various embodiments, the system further comprises an upconverter configured to upconvert the input signal to an intermediate frequency prior to the predistorter module comparing the input signal to the feedback signal. The system may comprise a downconverter configured to downconvert the feedback signal to an intermediate frequency prior to the predistorter module comparing the input signal to the feedback signal. The system may comprise an upconverter configured to upconvert the distorted output signal to a high frequency prior to the GaN power amplifier amplifying the power of the distorted output signal. The high frequency may be the final frequency transmitted by the antenna.

The system may comprise a waveguide configured to receive the amplified signal from the GaN power amplifier and provide the amplified signal to the antenna. In one example, the wireless communications system is a microwave wireless communications system.

In some embodiments, the system may further comprise an automatic gain adjuster (AGC) configured to adjust the gain of the feedback signal prior to the feedback signal being received by the predistorter module.

An exemplary method may comprise receiving an input signal and a feedback signal, comparing the input signal and the feedback signal to detect existing distortion within the feedback signal, generating, by a predistorter module, a distorted output signal with added distortion, the added distortion based on the detected existing distortion, amplifying, with a GaN power amplifier, the distorted output signal to generate an amplified signal, generating a feedback signal based on the amplified signal, and transmitting the amplified signal with an antenna.

Another exemplary system may comprise a means for detecting existing distortion of a feedback signal by comparing the input signal to the feedback signal, a means for generating a distorted output signal with added distortion based on the detected existing distortion, a GaN power amplifier configured to amplify the distorted output signal to generate an amplified signal, wherein the GaN power amplifier adds amplifier distortion to the distorted output signal which is cancelled, at least in part, by the added distortion, a means for generating a feedback signal based on the amplified signal, and an antenna configured to transmit the amplified signal.

Other features and aspects of various embodiments will become apparent from the following detailed description, taken in conjunction with the accompanying drawings, which illustrate, by way of example, the features of the various embodiments.

DETAILED DESCRIPTION OF VARIOUS EMBODIMENTS

In some embodiments, an upconverting transmitter chain performs a predistortion function at an intermediate frequency (IF) and a final stage power amplifier is a gallium nitride (GaN) device. In one example, the GaN power amplifier may be operated in class AB or class B mode. Since pre-distortion may be performed at a low frequency (IF) and in a limited range, a common architecture may be developed for use in radio frequency units from 6 to 40 GHz. In some embodiments, a transceiver comprises a final stage GaN power amplifier that may provide sufficient linearity performance at elevated output power levels. The sample port of the transceiver may provide a feedback signal to a predistorter block where the feedback signal may be compared with the input signal and then a predistorted output signal may be generated and fed to the input port of the transceiver. To bring the frequency of the feedback signal in line with the input signal, a downconversion process may be performed using the same oscillator module as that used by the transceiver for the upconverting function.

In the prior art, the final stage power amplifier in a conventional transceiver usually consists of multiple parallel GaAs FET stages and multi-stage matching networks. Since a GaN FET has a smaller periphery for the same output power, the input impedance of a GaN FET is typically much higher than that of a GaAs FET, thus making it much easier to match over a relatively wide bandwidth without the need for elaborate matching networks. In addition, the design complexity may be considerably reduced. Since GaN FETs may operate at much higher voltages (28V to 50V), the overall reliability of the system may be increased. In other words, for the same reliability as that found in the prior art, the output power may be increased.

Figure 1:
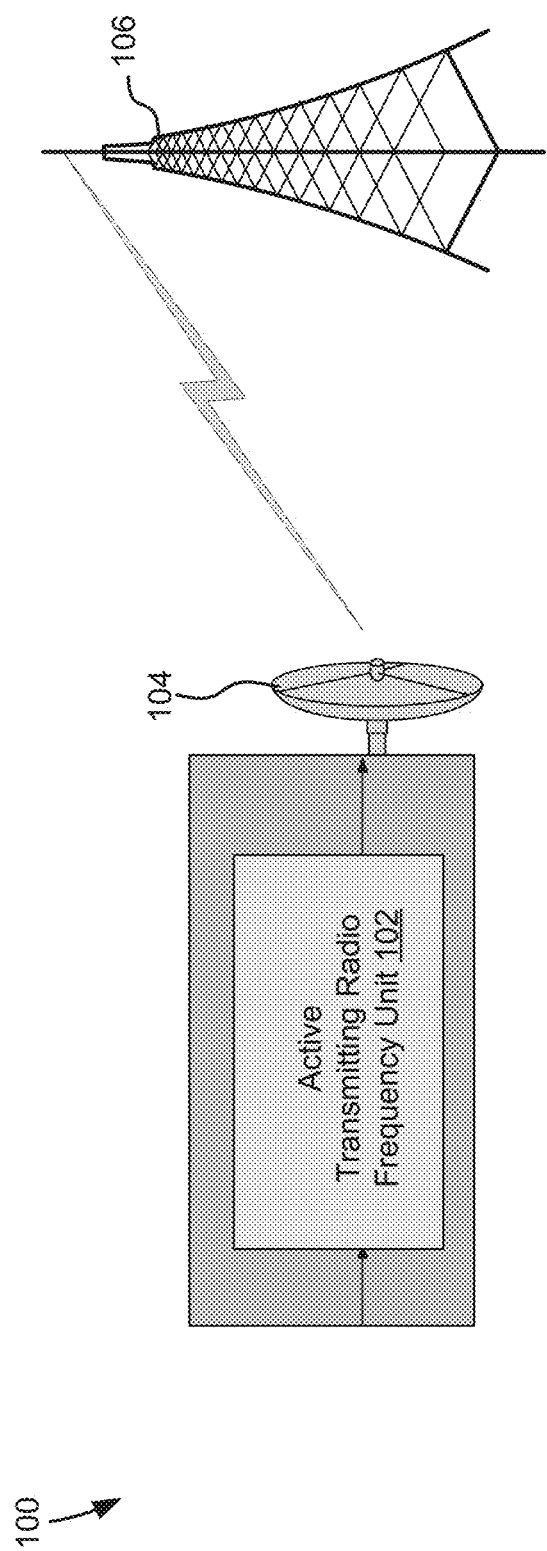
FIG. 1 depicts an active transmitting radio frequency unit (RFU) in some embodiments.

FIG. 1 depicts an active transmitting radio frequency unit (RFU) 102 in some embodiments. In one example, the active transmitting RFU 102 in environment 100 provides a wireless signal to a wireless communication tower 106 (e.g., cell tower or other microwave radio device) via an antenna 104. The active transmitting RFU 102 may comprise a GaN power amplifier rather than the traditional GaAs devices found in the prior art.

Gallium Nitride (GaN) is a wide-band gap semiconductor material that may be operated at a high drain voltage (e.g., in the range of 20 V to 60 V) and may also offer a higher output power capability (e.g., in the range of 4-8 W/mm). GaN power amplifiers may thus be easier to match over a wider bandwidth, have better reliability, and improved ruggedness compared to GaAs devices. In addition, the use of a linearization circuitry can allow the operation of the final stage power amplifier in a class AB or Class B mode thus affording much higher power added efficiency (PAE).

In one example, compared to existing GaAs solutions, the use of a GaN solution may provide up to 3 dB extra output power without linearity or SNR degradation. In another example, the implementation of a predistorter circuit may provide up to 10 dB reduction of spectral re-growth and 2 dB to 5 dB SNR improvement. Those skilled in the art will appreciate that the replacement of the final stage GaAs power amplifier(s) by one or more GaN devices and the addition a predistorter circuit may provide considerable advantages over a standalone GaAs solution.

Figure 2:
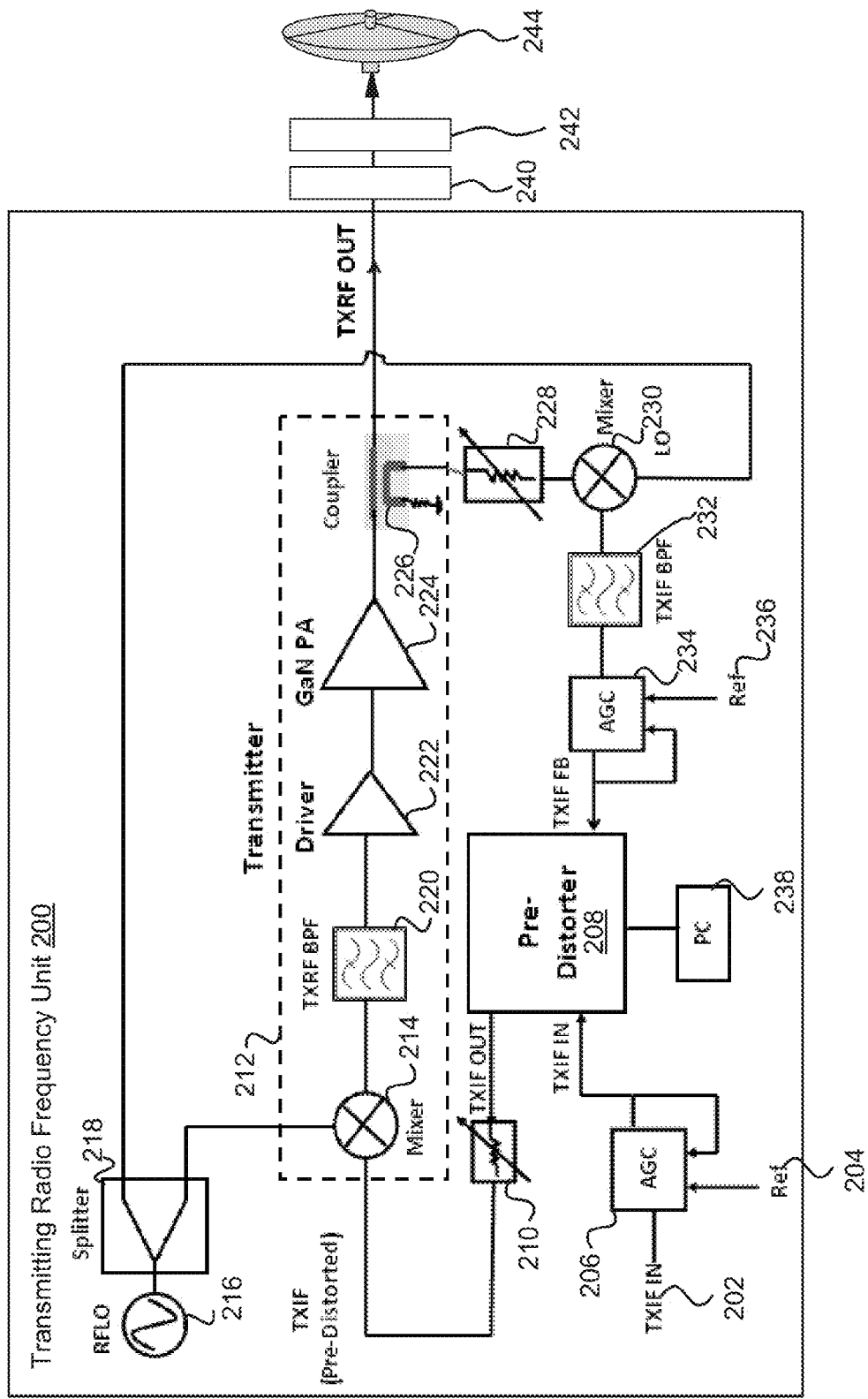
FIG. 2 is a block diagram of an exemplary transmitting radio frequency unit in some embodiments.

FIG. 2 is a block diagram of an exemplary transmitting radio frequency unit 200 in some embodiments. In some embodiments, the GaN power amplifier 224 is integrated into the transmitting radio frequency unit 200 (e.g., a functioning microwave radio) as a final stage power amplifier.

In various embodiments, the predistorter module 208 compares the input signal (TXIF IN) 202 with a down converted replica of an amplified signal at the output of the transmitter 212 and then generates a distorted (e.g., predistorted) output signal (e.g., TXIF OUT) for upconversion. Automatic Gain Control (AGC) circuits 206 and 234 may be utilized at the input and the feedback path of the predistorter module 208 to maintain power levels (e.g., at or close to an optimal point). In some embodiments, the predistorter module 208 may be controlled externally.

The transmitting radio frequency unit 200 may be any transmitter including, but not limited to, a heterodyne transmitter with a TX intermediate frequency (IF) output. The transmitting radio frequency unit 200 may comprise an AGC module 206, a predistorter module 208, a gain adjuster 210, a transmitter 212, a mixer module 214, a oscillation module 216, a splitter 218, a filter module 220, a driver 222, a GaN power amplifier 224, a coupler 226, a gain adjuster 228, a mixer module 230, a filter module 232, and an AGC module 234. The transmitting radio frequency unit 200 may provide a signal to a waveguide filter 240, waveguide 242, and antenna 244.

The AGC module 206 may comprise an automatic gain control (AGC) circuit configured to increase or decrease the gain of the intermediate signal 202 (e.g., TXIF IN). Similarly, the AGC module 234 may comprise an AGC circuit configured to increase or decrease the gain of the signal received from the filter module 232. The AGC module 206 and/or 234 may comprise many different types of AGCs with many different electrical properties. The AGC module 206 and 234 may adjust the gain of the intermediate signal 202 and filtered feedback signal from the filter module 232, respectively, based on one or more reference signals.

The AGC module 206 and/or 234 may each include one or more components. For example, the AGC module 206 and/or 234 may each comprise one or more AGCs. In some embodiments, the AGC module 206 and/or 234 may adjust the gain of the signals to be received by the predistorter 208 to be with in the operating range or preferred operating range of the predistorter 208.

The predistorter module 208 may receive the adjusted signal TXIF IN (i.e., intermediate input signal) from AGC module 206 as well as the adjusted signal TXIF FB (i.e., intermediate feedback signal) from the AGC module 234. In various embodiments, the predistorter module 208 inversely models gain and phase characteristics and produces a signal that will reduce distortion and increase linearity of the final signal that is provided to the antenna. The predistorter module 208 may introduce "inverse distortion" into the output signal that will be received by the transmitter 212 to cancel non-linearity which may be caused by one or more components (e.g., the GaN power amplifier 224).

For example, the predistorter module 208 may compare the feedback signal (i.e., TXIF FB) received from the AGC module 234 to the input signal (i.e., TXIF IN) received from the AGC module 206 to detect existing distortion in the feedback signal. If the feedback signal contains distortion, the predistorter module 208 may introduce "inverse distortion" to cancel non-linear distortion that may be added by other components of the transmitting radio frequency unit 200. In one example, the feedback signal operates a control signal of the predistorter module 208 to control an amount of distortion introduced into the output signal provided to the gain adjuster 210 and/or the transmitter 212.

In some embodiments, the predistorter 208 may compare the input signal to the feedback signal to determine if there is distortion in the intermediate feedback signal. The predistorter module 208 may determine to add inverse distortion to the intermediate output signal if detected distortion is greater than a predetermined threshold of distortion. In one example, the predistorter module 208 may tolerate a limited amount of distortion in the feedback signal before increasing or decreasing inverse distortion.

In some embodiments, the distortion threshold may be set by the PC 238. The PC 238 may be any digital device. A digital device may be any device with memory and a processor. Although the PC 238 is depicted in FIG. 2, those skilled in the art will appreciate that the PC 238 may not be a part of the transmitting radio frequency unit 200 (e.g., the PC 238 may be remote).

Those skilled in the art will appreciate that that the predistorter module 208 may be optional. For example, an IF input signal 202 may be received by the gain adjuster 210 and/or the transmitter 212 without predistortion (or gain adjustment by the AGC module 206). In this example, the transmitting radio frequency unit 200 may not include the feedback path (i.e., the coupler 226, gain adjuster 228, mixer module 230, filter module 232, or AGC module 234).

In this example, distortion introduced by the GaN power amplifier 224 may not be cancelled by predistortion or may be cancelled by predistortion or postdistortion (i.e., adding inverse distortion that cancels distortion added in the signal by other components). For example, one or more components may be selected and included in the circuit that, among other functions, may increase distortion which may cancel the distortion added by other components, such as the GaN power amplifier 224.

The gain adjuster 210 may increase or decrease the gain of the intermediate output signal received from the predistorter module 208. In some embodiments, the gain adjuster 210 may adjust the gain of the intermediate output signal to be with in the operating range or preferred operating range of the transmitter 212. Similarly, the gain adjuster 228 may increase or decrease the gain of the amplified signal received from the coupler 226. In some embodiments, the gain adjuster 228 may adjust the gain of the intermediate output signal to be with in the operating range or preferred operating range of the mixer module 230.

The gain adjusters 210 and 228 may each comprise many different types of gain adjusters with many different electrical properties. The gain adjuster 210 and/or 228 may include one or more components.

The mixer module 214 and the oscillator module (RFLO) 216 may represent an upconverter configured to upconvert the adjusted output signal from the gain adjuster 210 to generate an upconverted output signal. The upconverted output signal may beat the final frequency that is output by an antenna.

Similarly, the mixer module 230 and oscillator module 216 may represent a downconverter configured to downconvert a sampled signal from the coupler 226 to generate the feedback signal (e.g., at an intermediate frequency). Those skilled in the art will appreciate that there may be any number of upconverters or downconverters configured to upconvert and/or downconvert the signals within the transmitting radio frequency unit 200.

In some embodiments, the mixer module 214 mixes a signal received from the gain adjuster 210 with the oscillating signal from the oscillator module 216 (e.g., received via the splitter 218). The mixer module 230 may mix the signal received from the gain adjuster 228 with the oscillating signal from the oscillator module 216 (e.g., received via the splitter 218).

Those skilled in the art will appreciate that, in some embodiments, there may be multiple oscillator modules that each provide an oscillating signal to the mixer module 214 and the mixer module 230, respectively. In some embodiments, the splitter 218 is optional.

The mixer modules 214 and 230 may comprise many different types of mixers with many different electrical properties. Further, each mixer modules 214 and 230 may include one or more components. For example, the mixer module 214 may comprise one or more mixers.

The oscillator module 216 may provide an oscillating signal that may be used to upconvert and/or downconvert a signal. The oscillator module 216 may comprise any kind of oscillator with any different electrical properties. In one example, the oscillator module 216 provides an oscillating signal to the mixer module 214 and the mixer module 230 (via the splitter 216).

The oscillator module 216 may be local or remote. In one example, the oscillator module 216 may be remotely located and configured to provide an oscillating signal to one or more transmitting radio frequency units. The oscillator module 216 may include one or more components. For example, the oscillator module 216 may comprise one or more oscillators.

Those skilled in the art will appreciate that there may be any number of oscillator modules. In some embodiments, the splitter 218 is optional. For example, mixer modules 218 and 230 may receive oscillating signals from different oscillators. The splitter 218 is any device configured to provide oscillating signals to two or more different components.

The filter modules 220 and 232 may be any type of filter configured to filter signals. In one example, the filter module 220 may be bandpass filter configured to filter the signal received from the mixer module 214. In some embodiments, the filter module 220 is part of a upconverter configured to upconvert the signal from the gain adjuster 210 and/or the predistorter module 208 to a greater frequency such as a final frequency (i.e., the frequency at which the signal is transmitted by the antenna 244). The filter module 232 may filter a signal received from the mixer module 230. The filter module 232 may be a part of a downconverter configured to downconvert the feedback signal from the coupler 226.

The filter modules 220 and 232 may comprise many different types of filters (e.g., bandpass filter, low pass filter, high pass filter, or the like) with many different electrical properties. Filter modules 220 and 232 may comprise the same, similar, or different filters. Further, filters modules 220 and 232 may comprise filters of a similar type but have different electrical properties. Each filter modules 220 and 232 may include one or more components. For example, the filter module 220 may comprise one or more filters.

The driver 222 may be any amplifier and/or attenuator. In one example, the driver comprises one or more GaAs IMFETs. In some embodiments, the driver 222 may receive the filtered signal from the filter module 220 and amplify or attenuate the signal. The driver 222 may provide the signal to the GaN power amplifier 224. In some embodiments, the driver 222 is optional.

Those skilled in the art will appreciate that the driver 222 may comprise or be replaced by an amplification/attenuation module. The amplification/attenuation module may comprise an amplifier and/or an attenuator configured to amplify and/or attenuate a signal. The amplification/attenuator module may be any kind of amplifier and/or attenuator. Further, the amplification/attenuator module may comprise one or more amplifiers and/or attenuators with any kind of electrical properties.

The GaN power amplifier 224 amplifies the power of the signal received from the driver 222. In some embodiments, the amplified signal may then be provided to a waveguide filter 240, waveguide 242, and/or antenna 244 for transmission at the improved power.

The GaN power amplifier 224 may be integrated into a functioning microwave radio (e.g., transmitting radio frequency unit 200) as the final stage power amplifier. Those skilled in the art will appreciate that any GaN device may be used as or within a power amplifier. In one example, a 15 W gallium nitride (GaN) high electron mobility transistor (HEMT) designed specifically for high efficiency, high gain and wide bandwidth capabilities may be utilized. This device has a nominal gain of 10.5 dB and is biased at +28 V drain voltage and quiescent drain current of 115 mA. The device may be mounted in an air cavity screw down flange package and may be matched for operation in the frequency range of 5.5 GHz to 5.8 GHz.

Although a single GaN power amplifier 224 is depicted in FIG. 2, those skilled in the art will appreciate that there may be any number of GaN power amplifiers 224. For example, multiple GaN power amplifiers 224 may be a part of a matching network.

In various embodiments, the addition of the GaN power amplifier 224 results in less loss of DC power due to DC-DC conversion efficiency. Further, GaN power amplifiers 224 may have higher power out per unit periphery and therefore may be easier to match than GaAs FET devices for same Pout. GaN power amplifiers 224 may be designed to achieve broadband operation without cumbersome multi-stage matching networks.

Those skilled in the art will appreciate that the addition of a fixed frequency linearizer (e.g., predistorter module 208) to the transmitter chain along with the final stage GaN power amplifier 224 allows the operation of transistor in class AB or class B mode. Operation of power amplifiers in class AB or class B mode may greatly improve the efficiency over the traditional class A mode of operation. Those skilled in the art will appreciate that the overall system may be optimized for best trade-off of DC power consumption, power out, and linearity with the given electrical/mechanical constraints.

Further, those skilled in the art will appreciate that use of the GaN power amplifier 224 over alternatives may lead to high transmitter power at the same or lower DC power consumption. Moreover, combining the GaN power amplifier 224 with the predistorter module 208 may lead to improved linearity and same power out or same linearity at higher power out. In some embodiments, power amplifier DC power efficiency may be improved. This also may allow for the option to reduce DC power consumption of the transmitter 212 for "green" mode. In various embodiments, the combination of the GaN power amplifier 224 and the predistorter module 208 may lead to an increase of the overall yield by lowering the junction temperature of the power amplifier for the same power out. Further, a broadband, high-efficiency power amplifier may be designed with a reduced number of transmitter options.

In some embodiments, the transmitting radio frequency unit 200 may comprise or communicate with the waveguide filter 240 and the waveguide 242. The waveguide filter 240 may be any filter coupled to the waveguide 242 and configured to filter the electromagnetic waves (e.g., remove noise). The waveguide 242 may provide the signal to the antenna 244. The waveguide 242 may be any waveguide kind or type of waveguide. For example, the waveguide 242 may be hollow and/or comprise a dielectric. In some embodiments, the waveguide 242 comprises a rectangular to circular waveguide.

In various embodiments, a feedback path provides a replica of the amplified signal from the GaN power amplifier 224 back to the predistorter 208. The feedback path may comprise the coupler 226, the gain adjuster 228, the mixer module 230, the filter module 232, and the AGC module 234.

The coupler 226 is any type of component configured to sample or split the amplified signal from the GaN power amplifier 224. In some embodiments, the coupler 226 samples the amplified signal to create the feedback signal The feedback signal may be provided to the gain adjuster 228 which may increase or decrease the gain of the feedback signal. In one example, the gain adjuster 228 decreases the gain of the feedback signal from the coupler 226 to be within a preferred operating range of the mixer module 230.

It will be appreciated that a "module" may comprise software, hardware, firmware, and/or circuitry. In one example, one or more software programs comprising instructions capable of being executable by a processor may perform one or more of the functions of the modules described herein. In another example, circuitry may perform the same or similar functions. Alternative embodiments may comprise more, less, or functionally equivalent modules and still be within the scope of present embodiments. For example, as previously discussed, the functions of the various modules may be combined or divided differently.

In various embodiments, those skilled in the art will appreciate that multiple transmitting radio frequency units may be used to transmit the same signal (e.g., signals containing the same information provided by a wireless communication source). Each transmitting radio frequency unit may adjust the phase of the signal to be transmitted, respectively, based on the same predetermined phase value. Similarly, each transmitting radio frequency unit may adjust the gain of the signal to be transmitted, respectively, based on the same gain value. As a result, the phase and gain of the signal from each transmitting radio frequency unit may be the same or substantially similar (e.g., the phase and gain of the signals may be identical). The signals may be subsequently combined to strengthen the signal. In one example, the signals are combined prior to transmission over the antenna. In another example, the signals are transmitted over different antennas and the signals spatially combine. U.S. nonprovisional patent application Ser. No. 13/249,202, entitled "Systems and Methods for Providing Signals of Multiple Active Wireless Transmitters," filed Sep. 29, 2011, is incorporated herein by reference.

Towards that end, the transmitting radio frequency unit 200 may further comprise a signal quality control module configured to generate a phase control signal to control a phase of a processed signal. The signal quality control module may receive the upconverted signal (e.g., the signal after upconversion by the mixer module 214) and mix the received signal with a local oscillator signal (e.g., from oscillator module 216). The signal quality control module may filter and/or compare the mixed signal with a predetermined phase value to generate a phase control signal based on the comparison. The phase control signal may control a phase adjuster which adjusts the phase of the signal within the transmitting radio frequency unit 200. In some examples, the phase adjuster adjusts the signal before or after the signal is upconverted by the mixer module 214.

In some embodiments, the signal quality control module may comprise a splitter to split the signal (e.g., amplified signal) between the phase comparator and a gain comparator. The phase comparator may generate the phase control signal based on a comparison of the phase of the mixed signal with a predetermined phase value. The gain comparator may generate the gain control signal based on a comparison of the gain of the split signal with a predetermined gain value. The gain control signal may control a gain adjuster (e.g., gain adjuster 210 or AGC module). In some embodiments, the transmitting radio frequency unit 200 comprises a gain adjuster configured to receive the signal before or after the mixer module 214 upconverts the signal.

The phase adjuster may comprise a variable phase control circuit configured to increase or decrease the phase of the signal to be transmitted. The phase adjuster may comprise any type of phase adjuster or phase shifter with different electrical properties. The phase adjuster may adjust the phase of the signal based on the phase control signal from the signal quality control module. The phase adjuster may include one or more components. For example, the phase adjuster may comprise one or more phase control elements.

Figure 3:
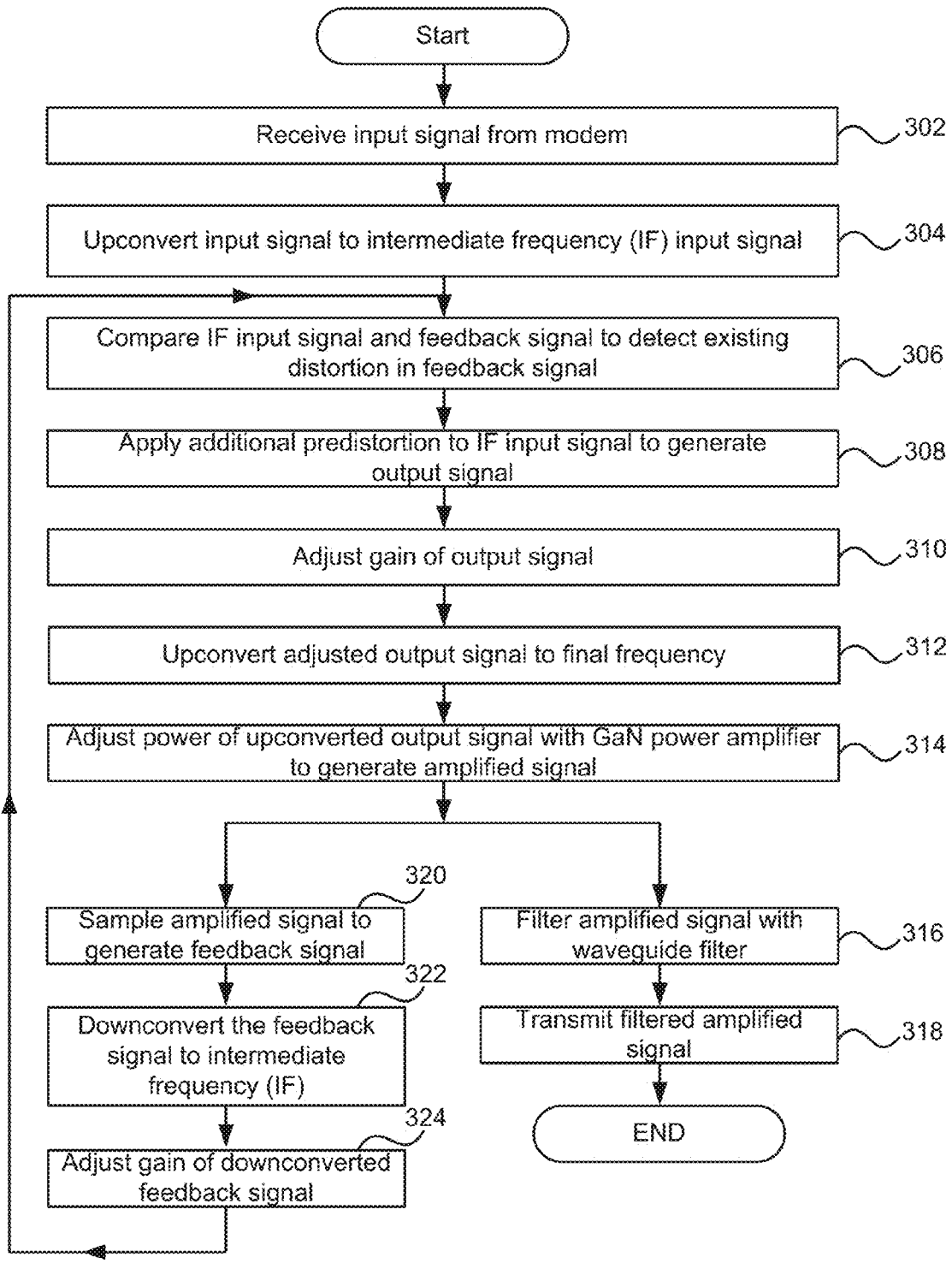
FIG. 3 is a flow chart of an exemplary method for increasing linearity and power of a wireless transmission system in some embodiments.

FIG. 3 is a flow chart of an exemplary method for increasing linearity and power of a wireless transmission system in some embodiments. In step 302, a modem receives a signal and provides an input signal to an upconverter. The upconverter may comprise a mixer module configured to mix an oscillating signal with the signal from the modem to generate an intermediate frequency input signal. In some embodiments, the upconverter may filter the oscillating signal from an oscillator module prior to mixing the signals. In various embodiments, the modem may provide I and Q signals which may be upconverted to generate the upconverted input signal.

Those skilled in the art will appreciate that the input signal may be received by the predistorter module 208 at an initial frequency, intermediate frequency, final frequency, or any other kind of frequency. Different predistorter modules 208 may comprise different operating regions. Although a predistorter module 208 may be designed to operate using high frequencies (e.g., the final frequency for transmission), these types of predistorter modules 208 may be expensive when compared to other types of predistorter modules 208 that operate at lower frequency ranges.

In step 304, an upconverter upconverts the input signal from the modem to an intermediate frequency (IF). The IF input signal may then be provided to the automatic gain controller (AGC) 206 or the predistorter module 208.

In some embodiments, the IF input signal is received by the AGC 206 which may increase or decrease the gain of the IF input signal before providing the IF input signal to the predistorter module 208. In one example, the AGC 206 compares the IF input signal 202 to a reference signal 204 to determine an increase or decrease of gain of the IF input signal 202. The AGC 206 may adjust the gain of the IF input signal 202 so that gain of the signal is within an operating range or preferred operating range of the predistorter module 208.

A predistorter module 208 may receive the IF input signal and a feedback signal. The feedback signal may be based on a signal that has been amplified by a GaN power amplifier and/or other components in preparation for transmission. The feedback signal may comprise existing distortion caused by one or more components such as the GaN power amplifier.

In step 306, the predistorter module 208 may compare the IF input signal and the feedback signal to detect existing distortion (if any) of the feedback signal. In order to improve linearity, the predistorter module 208 may add "inverse distortion" to the IF input signal to generate a distorted output signal. The "inverse distortion" of the distorted output signal may cancel or reduce added distortion caused by other components of the transmitting radio frequency unit 200 which thereby increases linearity of the system.

In step 308, the predistorter module 208 applies additional predistortion, based on the detected existing distortion of the feedback signal, to the IF input signal to generate the output signal (i.e., the distorted output signal). In step 310, the gain adjuster 210 adjusts the gain of the output signal and provides the adjusted output signal to the transmitter 212.

In step 312, an upconverter upconverts the adjusted output signal from the gain adjuster 210 to the final frequency. For example, the mixer module 214 may mix an oscillating signal from the oscillator module 216 to upconvert the adjusted output signal. Those skilled in the art will appreciate that the upconverted adjusted output signal may be further upconverted at any time.

In some embodiments, the upconverted output signal may be filtered by filter module 220. Further, the upconverted output module may be amplified and/or attenuated by driver 222.

In step 314, the GaN power amplifier 224 adjusts the power of the upconverted output signal to generate an amplified signal. In various embodiments, the GaN power amplifier 224 may add distortion (e.g., all or some of the existing distortion) to the amplified signal. The added distortion, however, may be cancelled or reduced by the distortion (e.g., inverse distortion) added by the predistorter module 208.

In step 316, the amplified signal from the GaN power amplifier 224 may be filtered with the waveguide filter 240 and propagated by waveguide 242 prior to being provided to the antenna 244. In various embodiments, the waveguide filter 240 and waveguide 242 prepare the signal for transmission in a microwave transmission system.

In step 318, the antenna 244 transmits the filtered amplified signal.

In step 320, a feedback signal is generated based on the amplified signal from the GaN power amplifier 224. In one example, the coupler 226 may sample the amplified signal to generate the feedback signal. The gain adjuster 228 may subsequently adjust the gain of the feedback signal.

In step 322, the feedback signal may be downconverted (e.g., to the intermediate frequency). In one example, the feedback signal may be mixed with an oscillating signal by the mixer module 230. The oscillating signal may be from the oscillator module 216 (e.g., via the splitter 218).

Those skilled in the art will appreciate that the mixer module 230 may mix the feedback signal with an oscillating signal from another oscillator module (e.g., not the oscillator module 216). In some embodiments, the oscillating signal may be filtered prior to mixing by the mixer module 230. The downconverted feedback signal may be filtered by the filter module 232.

In step 324, the gain of the downconverted feedback signal may be adjusted by the AGC module 234. In some embodiments, the AGC module 234 may adjust the gain of the downconverted feedback signal based on reference signal 236. The reference signal 236 may be the same reference signal as reference signal 204.

Those skilled in the art will appreciate that the gain of the input signal and the gain of the feedback signal may be adjusted such that the signals are within the operating range and/or preferred operating range of the predistorter module 208.

In various embodiments, the phase and gain of a signal within the transmitting radio frequency unit 200 may be adjusted. In one example, multiple transmitting radio frequency units may be configured to transmit the same data over one or more antennas. In order to reduce or eliminate destructive interference and/or improve signal strength, the gain and/or phase of the signals from the different transmitting radio frequency units may be the same or similar.

In various embodiments, a phase adjuster may adjust the phase of the signal. The phase adjuster may adjust the phase of the signal at any point including, for example, before the distortion is added to the signal by the predistorter module 208, after distortion is added to the signal by the predistorter module 208, before the signal is upconverted from the IF frequency, after the signal is upconverted from the IF frequency, before the signal is amplified by the GaN power amplifier 224, or after the signal is amplified by the GaN power amplifier 224.

The phase adjuster may be a phase shifter or any other element configured to alter the phase of the signal. In one example, the phase adjuster is controlled by the phase control signal from the signal quality control module.

Further, the gain adjuster 210 or another AGC module may adjust the gain of the signal based the gain control signal (i.e., the AD signal) from the signal quality control module. Those skilled in the art will appreciate that the gain of the signal may be adjusted at any point in the circuit of transmitting radio frequency unit 200.

The signal quality control module may compare the phase of the signal (e.g., either before or after the GaN power amplifier 224 amplifies the power of the signal) to a predetermined phase value and create the phase control signal based on the comparison. The signal quality control module may control the phase adjuster with the phase control signal. The predetermined phase value may be based on the characteristics of one or more transmitters and/or the signal to be adjusted.

The signal quality control module may also compare the signal (e.g., either before or after the GaN power amplifier 224 amplifies the power of the signal) to a predetermined gain value and creates the gain control signal based on the comparison. The signal quality control module may control the gain adjuster 210 or other AGC module with the gain control signal. The predetermined gain value may be based on the characteristics of one or more transmitters and/or the signal to be adjusted.

In various embodiments, a second transmitting radio frequency unit performs steps 302-314 and a coupler combines the signal from the two transmitting radio frequency units. In various embodiments, a single radio enclosure houses both the first and second microwave transmitting radio frequency units. The two microwave transmitting radio frequency units may share the same antenna. Combing the signals may strengthen the signals as a result of the phase and gain being the same or substantially similar.

In various embodiments, the signal may be filtered in a waveguide filter and/or provided to the antenna via a waveguide for transmission. The waveguide filter and/or the waveguide may be a part of the radio enclosure or outside of the radio enclosure. The antenna may transmit the signal from both of the microwave transmitting radio frequency units.

It should be understood that those of ordinary skill in the art would appreciate that one or more steps of the method as illustrated in FIG. 3 could be performed in the context of other systems or components. Further, it should be noted that the steps may be performed in any order.

Figure 4:
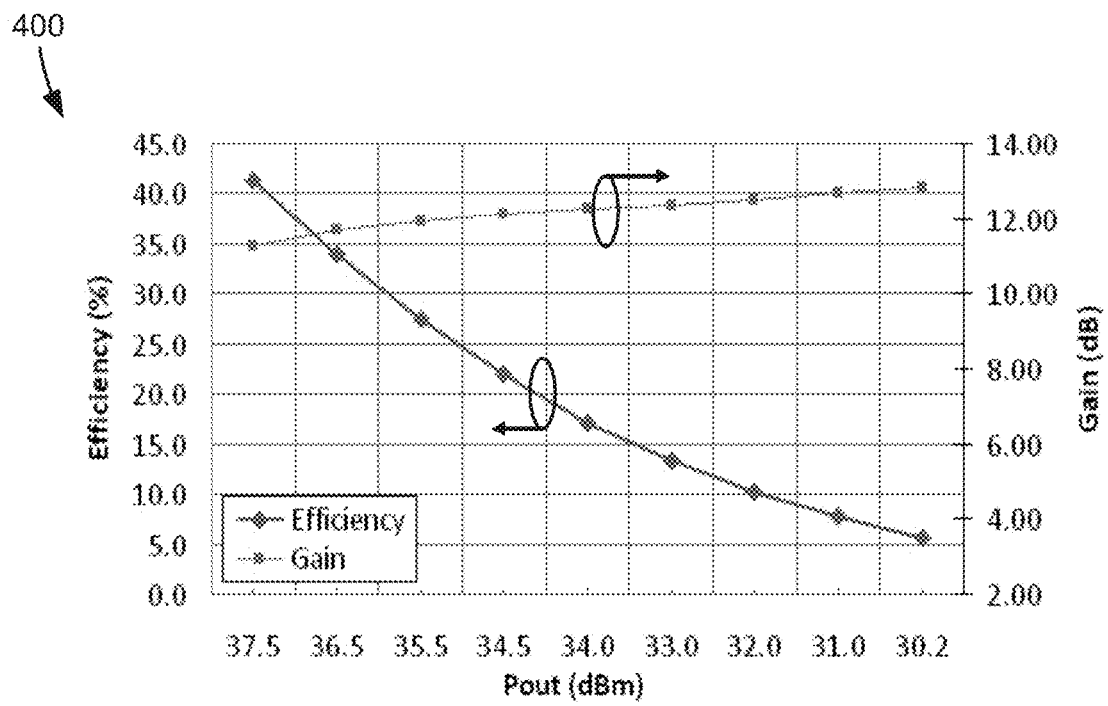
FIG. 4 is a graph depicting gain and power added efficiency (PAE) of a standalone 15 Watt GaN power amplifier at 5.80 GHz in some embodiments.
Figure 5:
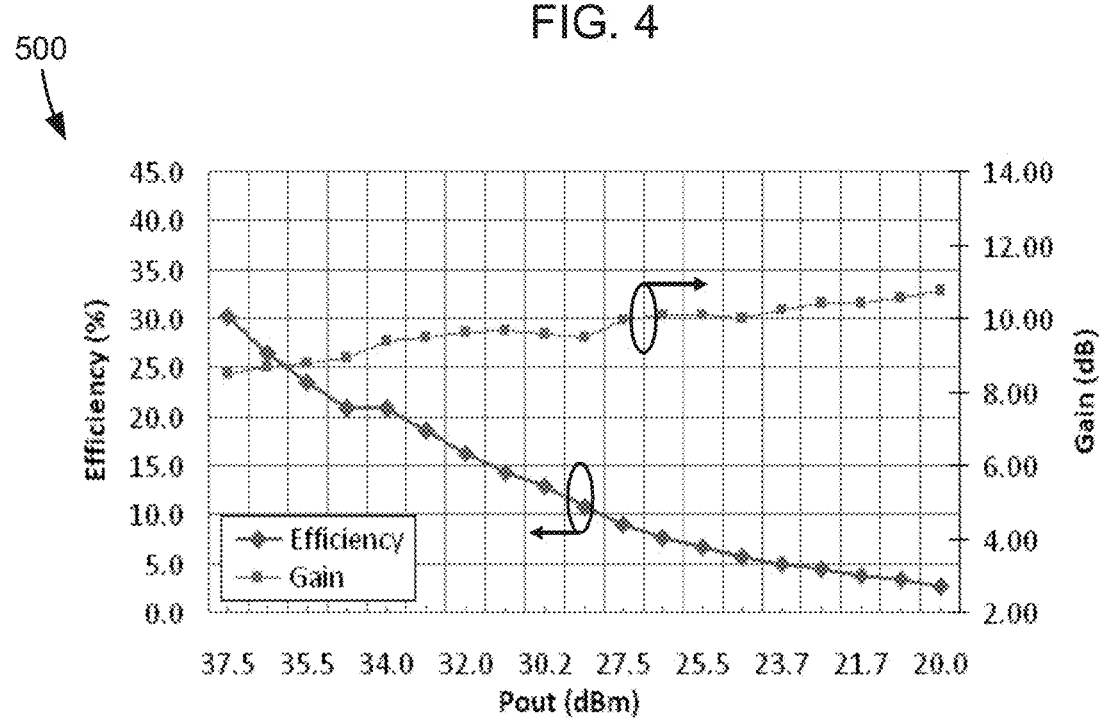
FIG. 5 is a graph depicting gain and power added efficiency (PAE) of a standalone 15 Watt GaN power amplifier at 5.80 GHz used in a microwave transmitter as the final stage power amplifier in some embodiments.

FIG. 4 is a graph 400 depicting gain and power added efficiency (PAE) of a standalone 15 Watt GaN power amplifier at 5.80 GHz in some embodiments. FIG. 5 is a graph 500 depicting gain and power added efficiency (PAE) of a standalone 15 Watt GaN power amplifier at 5.80 GHz used in a microwave transmitter as the final stage power amplifier in some embodiments. The power amplifier may be characterized for gain and efficiency at a fixed frequency point of interest. Gain may roll off slightly at higher output power levels while efficiency may roll off at reduced power out levels. The gain and efficiency of the 15 W GaN power amplifier when integrated into a microwave transmitter chain is shown in FIG. 4 and may be compared to those in FIG. 5. These exemplary figures show that the efficiency drops when the GaN power amplifier is included in the Tx chain compared to when it is standalone using an external ultra-linear driver amplifier. In one example, the GaN amplifier may be biased for class AB mode of operation.

Figure 6:
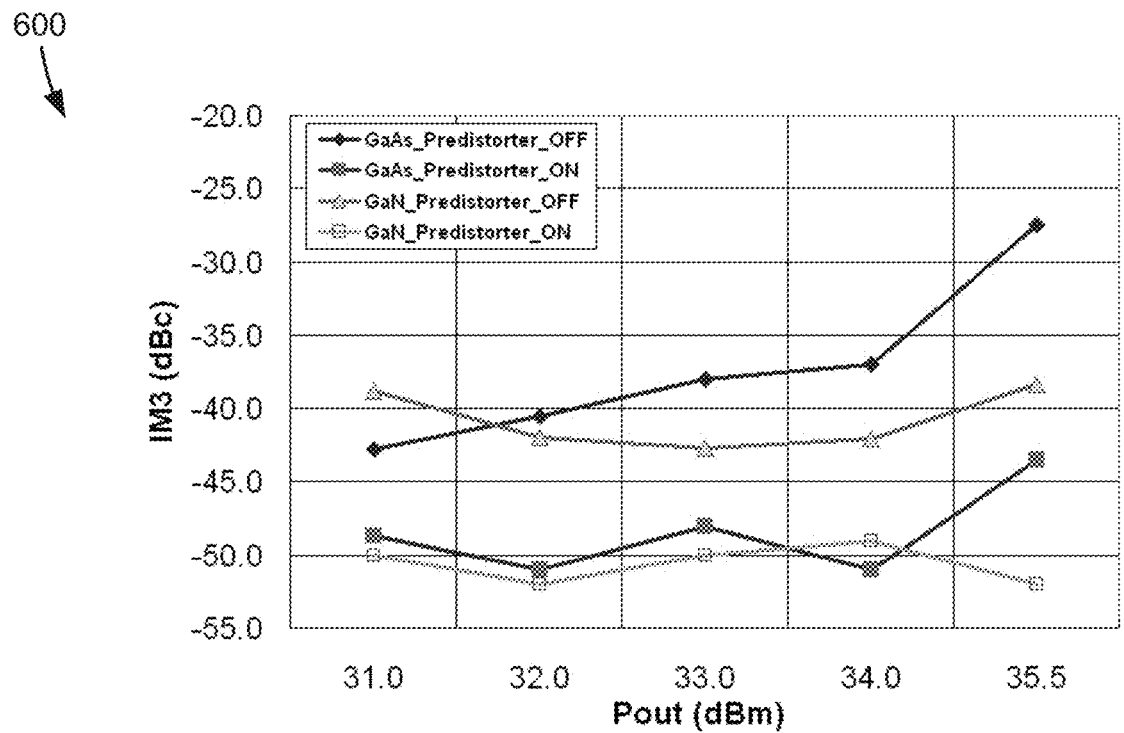
FIG. 6 is a graph depicting $3^{rd}$ order intermodulation distortion (IM3) of a standalone 15 Watt GaN power amplifier and a GaAs IMFET (8 Watt) power amplifier with two tones spaced 2 MHz apart at 5.80 GHz in some embodiments.

System level tests may be performed using both two tone signals spaced 2 MHz apart and also using a variety of digitally modulated complex waveform. FIG. 6 is a graph 600 depicting $3^{rd}$ order intermodulation distortion (IM3) of a standalone 15 Watt GaN power amplifier and a GaAs IMFET (8 Watt) power amplifier with two tones spaced 2 MHz apart at 5.80 GHz in some embodiments. The comparison of IMD3 data for GaN and GaAs power amplifiers is plotted in FIG. 6. In comparison to the GaAs power amplifier, the GaN power amplifier shows improved linearity at the same power output level. At Pout level of 35.50 dBm the IM3 for GaN and GaAs power amplifier is −38.80 dBc and −27.50 dBc, respectively, without the predistorter active. When a predistorter is active, the linearity improved for both GaAs and GaN power amplifiers to −52.0 dBc and −43.5 dBc, respectively. The power consumption (with RF on) for GaN HEMT may be 15.4 W compared to 25.2 W for the GaAs IMFET.

Figure 7:
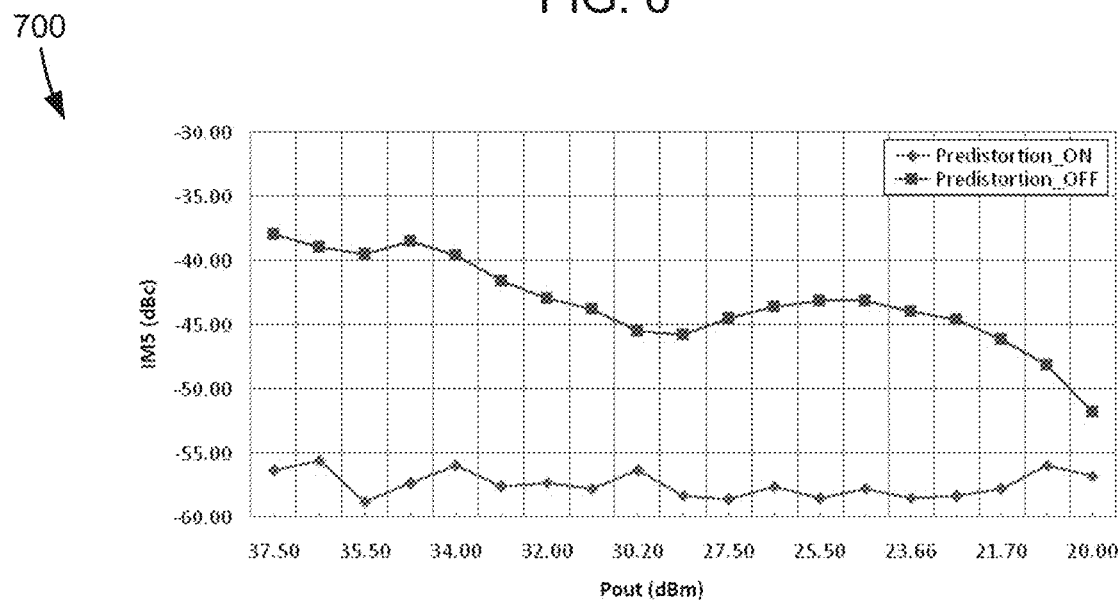
FIG. 7 is a graph depicting IMD5 data for a 15 W GaN power amplifier at 5.80 GHz with and without pre-distortion as a function of output power in some embodiments

FIG. 7 is a graph 700 depicting IMD5 data for a 15 W GaN power amplifier at 5.80 GHz with and without predistortion as a function of output power in some embodiments. The IM3 and IM5 data for the transmitter with the 15 W GaN power amplifier as the last stage amplifier with two tones spaced 2 MHz apart is shown in FIG. 6 and FIG. 7, respectively, as a function of composite output power. For IM3, the predistorter circuit may provide a correction of between 7 dB and 20 dB and may maintain the IM3 level below −47 dBc over the complete range of output power levels. For IM5, the predistorter circuit may provide a correction of between 4 dB and 15 dB and may maintain the IM5 level below −55 dBc over the complete range of output power levels. Linearity correction may be limited by the predistortion circuit even at the highest output power levels since the IM3 of the driver stage preceding the GaN power amplifier was at least 10 dB better.

Figure 8:
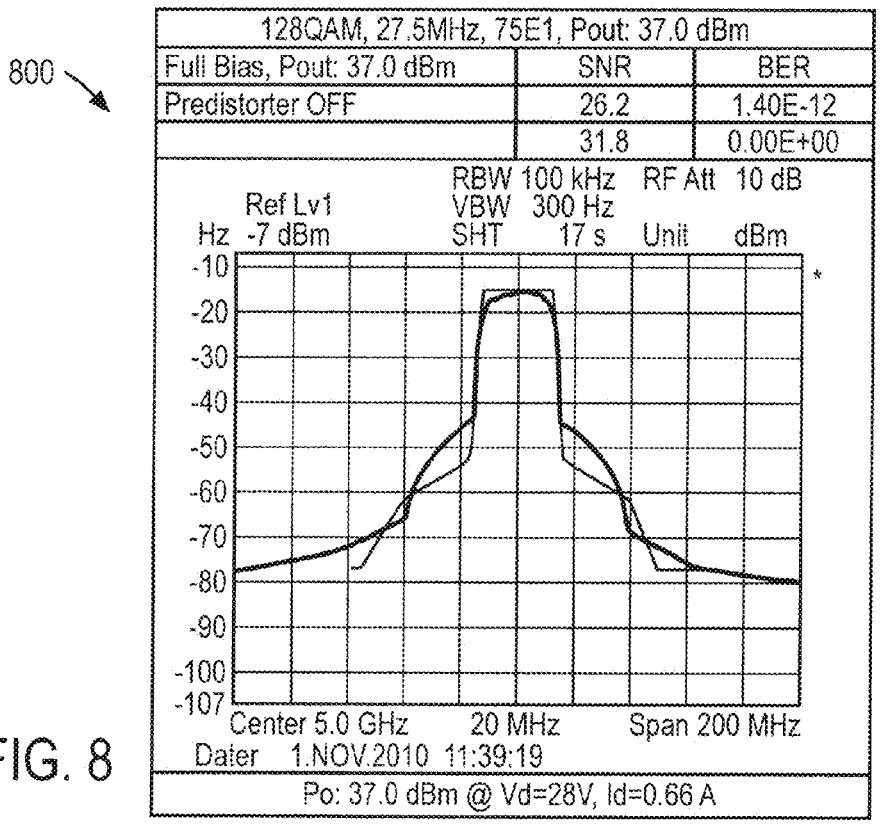
FIG. 8 is a graph of a spectral mask for 128 QAM modulated signal in 27.5 MHz bandwidth carrying 75E1 (E1=2.048 Mbps) traffic at 37.0 dBm output power 5.8 GHz using the 30 W GaN HEMT in some embodiments.
Figure 9:
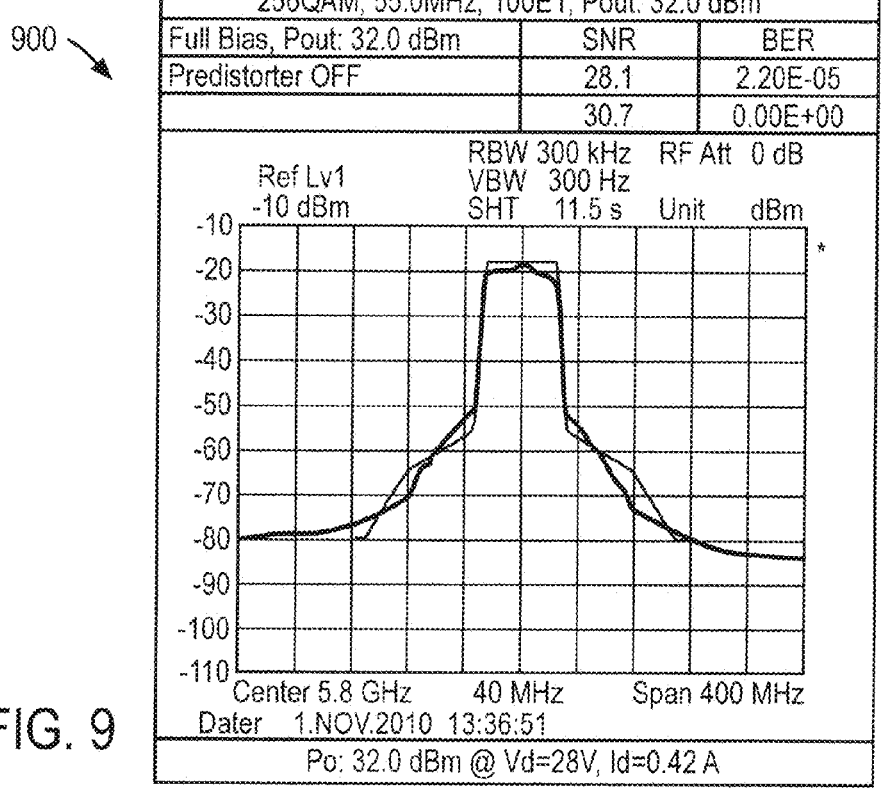
FIG. 9 is a graph of a spectral mask for a 128 QAM modulated signal in 55.0 MHz bandwidth carrying 100E1 (E1=2.048 Mbps) traffic at 32.0 dBm output power at 5.8 GHz using the 30 W GaN HEMT in some embodiments.

FIG. 8 is a graph 800 of a spectral mask for 128 QAM modulated signal in 27.5 MHz bandwidth carrying 75E1 (E1=2.048 Mbps) traffic at 37.0 dBm output power 5.8 GHz using the 30 W GaN HEMT in some embodiments. FIG. 9 is a graph 900 of a spectral mask for a 128 QAM modulated signal in 55.0 MHz bandwidth carrying 100E1 (E1=2.048 Mbps) traffic at 32.0 dBm output power at 5.8 GHz using the 30 W GaN HEMT in some embodiments. Mask compliance with the predistorter ON and OFF may also be performed for different modulation state, bandwidth, and power levels. FIG. 8 and FIG. 9 show the output mask with and without the predistorter for 37.0 dBm and 32.0 dBm output power. In both cases, an improvement of up to 10 dB of spectral regrowth may be obtained in some examples with the predistorter ON.

Figure 10:
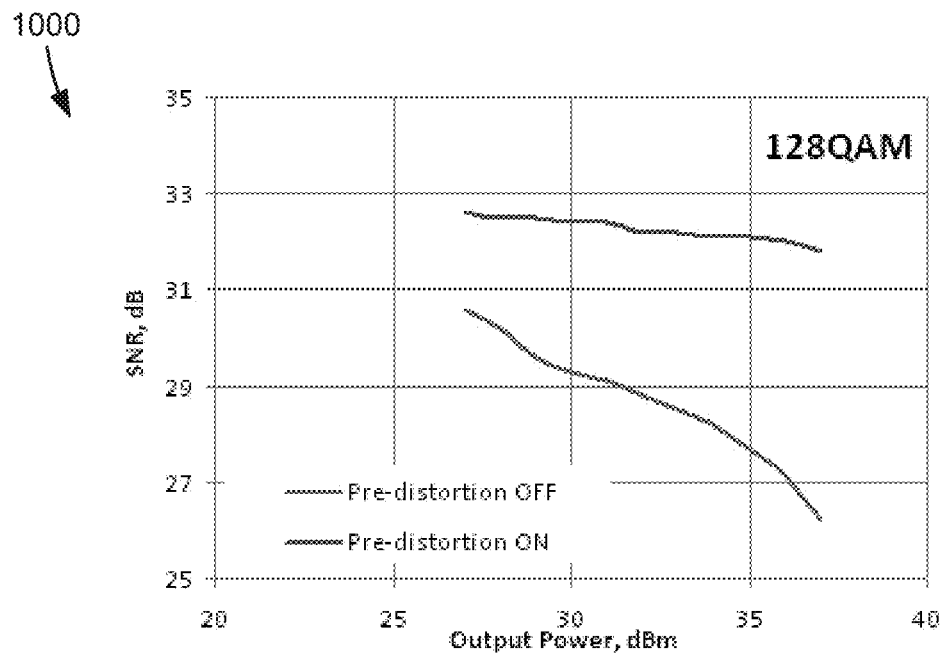
FIG. 10 is a graph depicting SNR as function of output power with and without the predistorter at 5.8 GHz for a 128 QAM modulated signal and 30 W GaN HEMT as the final stage power amplifier at 5.8 GHz in some embodiments.
Figure 11:
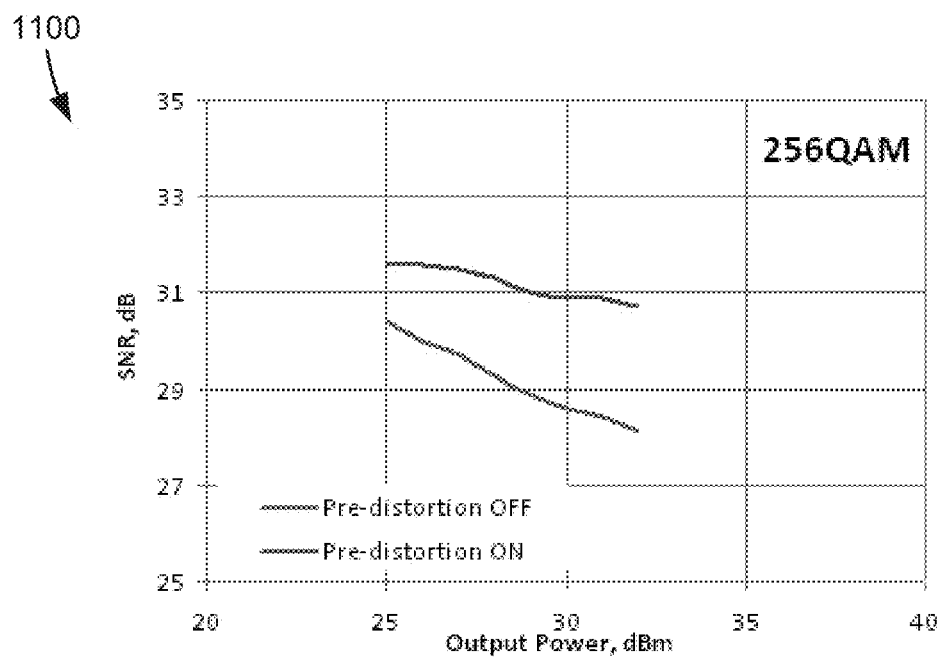
FIG. 11 is a graph depicting SNR as function of output power with and without the predistorter at 5.8 GHz for a 256 QAM modulated signal and 30 W GaN HEMT as the final stage power amplifier at 5.8 GHz in some embodiments.

FIG. 10 is a graph 1000 depicting SNR as function of output power with and without the predistorter at 5.8 GHz for a 128 QAM modulated signal and 30 W GaN HEMT as the final stage power amplifier at 5.8 GHz in some embodiments. FIG. 11 is a graph 1100 depicting SNR as function of output power with and without the predistorter at 5.8 GHz for a 256 QAM modulated signal and 30 W GaN HEMT as the final stage power amplifier at 5.8 GHz in some embodiments. An SNR improvement of 5.6 dB and 2.6 dB respectively for 128 QAM and 256 QAM signal may be recorded with the predistorter ON. In both cases, a non-zero BER may be observed when the predistorter was OFF. The SNR improvement and variation as a function of output power may also be recorded for both 128 QAM and 256 QAM modulated signals. The results may be depicted in FIG. 10 and FIG. 11, respectively. Without the predistorter active, the SNR may roll off as the output power is increased. When the predistorter is running, the SNR variation for both modulation states may be less than 0.5 dB.

Various embodiments are described herein as examples. It will be apparent to those skilled in the art that various modifications may be made and other embodiments can be used without departing from the broader scope of the present invention(s). Therefore, these and other variations upon the exemplary embodiments are intended to be covered by the present invention(s).

What is claimed is:

1. A wireless communications system comprising:
   a coupler configured to sample a first transmission signal at a transmission radio frequency to generate a feedback signal;
   a first feedback downconverter configured to downconvert a first signal to an intermediate frequency to generate an intermediate frequency second signal, the first signal being based on the feedback signal from the transmission radio frequency;
   a predistorter module configured to:
      receive an intermediate frequency third signal, the intermediate frequency third signal being based on the intermediate frequency second signal;
      compare the intermediate frequency third signal to an intermediate frequency input signal to detect existing distortion in the intermediate frequency third signal; and
      add inverse distortion to an output signal to generate a distorted output signal with added distortion, the inverse distortion added to the output signal being based on the existing distortion detected in the intermediate frequency third signal;
   a second upconverter configured to upconvert an intermediate frequency fourth signal to generate a transmission radio frequency fifth signal, the intermediate frequency fourth signal being based on the distorted output signal to the transmission radio frequency;
   a gallium nitride (GaN) power amplifier configured to amplify power of a transmission radio frequency sixth signal to generate a transmission radio frequency amplified signal, the GaN power amplifier adding amplifier distortion, wherein at least some of the added distortion from the predistorter module cancels at least some of the amplifier distortion, the transmission radio frequency sixth signal being based on the transmission radio frequency fifth signal; and
   an antenna configured to transmit a transmission radio frequency seventh signal, the seventh signal being based on the transmission radio frequency amplified signal.

2. The wireless communications system of claim 1, wherein the input signal is at the intermediate frequency.

3. The wireless communications system of claim 1, further comprising a waveguide configured to provide the transmission radio frequency seventh signal to the antenna.

4. The wireless communications system of claim 1, wherein the predistorter module is configured to add inverse distortion to an output signal upon a determination that the existing distortion is greater than a first predistortion threshold.

5. The wireless communications system of claim 4, wherein the first predistortion threshold is provided by a digital device.

6. The wireless communications system of claim 5, wherein the predistorter module is configured to receive a second predistortion threshold from the digital device.

7. The wireless communications system of claim 1, further comprising a first automatic gain adjuster (AGC) configured to adjust a gain of the intermediate frequency second signal before the predistorter module is configured to receive the intermediate frequency third signal.

8. The wireless communications system of claim 7, further comprising a second AGC configured to adjust a gain of the intermediate frequency input signal before the predistorter module is configured to compare the intermediate frequency third signal to the intermediate frequency input signal to detect existing distortion in the intermediate frequency third signal.

9. The wireless communications system of claim 1, further comprising an oscillator configured to assist the first feedback downconverter to downconvert the first signal and configured to assist the second upconverter to upconvert the intermediate frequency fourth signal.

10. The wireless communications system of claim 1, wherein the wireless communications system is a microwave wireless communications system.

11. A method comprising:
    sampling a first transmission signal at a transmission radio frequency to generate a feedback signal;
    downconverting a first signal to an intermediate frequency to generate an intermediate frequency second signal, the first signal being based on the feedback signal from the transmission radio frequency;
    receiving, by a predistorter module, an intermediate frequency third signal, the intermediate frequency third signal being based on the intermediate frequency second signal;
    comparing, by the predistorter module, the intermediate frequency third signal to an intermediate frequency input signal to detect existing distortion in the intermediate frequency third signal;
    adding inverse distortion, by the predistorter module, to an output signal to generate a distorted output signal with added distortion, the inverse distortion added to the output signal being based on the existing distortion detected in the intermediate frequency third signal;
    upconverting an intermediate frequency fourth signal to generate a transmission radio frequency fifth signal, the intermediate frequency fourth signal being based on the distorted output signal to the transmission radio frequency;
    amplifying power, by a gallium nitride (GaN) power amplifier, of a transmission radio frequency sixth signal to generate a transmission radio frequency amplified signal, the GaN power amplifier adding amplifier distortion, wherein at least some of the added distortion from the predistorter module cancels at least some of the amplifier distortion, the transmission radio frequency sixth signal being based on the transmission radio frequency fifth signal; and
    transmitting, by an antenna, a transmission radio frequency seventh signal, the seventh signal being based on the transmission radio frequency amplified signal.

12. The method of claim 11, wherein the input signal is at the intermediate frequency.

13. The method of claim 11, further comprising providing the transmission radio frequency seventh signal to the antenna via a waveguide.

14. The method of claim 11, wherein adding inverse distortion to the output signal comprises adding inverse distortion to the output signal upon a determination that the existing distortion is greater than a first predistortion threshold.

15. The method of claim 14, further comprising receiving the first predistortion threshold from a digital device.

16. The method of claim 15, further comprising receiving a second predistortion threshold from the digital device.

17. The method of claim 11, further comprising adjusting a gain of the intermediate frequency second signal before the predistorter module receives the intermediate frequency third signal.

18. The method of claim 11, further comprising adjusting a gain of the intermediate frequency input signal before the predistorter module compares the intermediate frequency third signal to the intermediate frequency input signal to detect existing distortion in the intermediate frequency third signal.

19. The method of claim 11, further comprising assisting, by an oscillator, the downconversion of the first signal and the upconversion of the intermediate frequency fourth signal.

20. The method of claim 11, wherein the transmission radio frequency seventh signal is a microwave signal.

* * * * *